United States Patent
Kondakova et al.

(10) Patent No.: US 7,084,425 B2
(45) Date of Patent: Aug. 1, 2006

(54) ORGANIC ELECTROLUMINESCENT DEVICES

(75) Inventors: Marina E. Kondakova, Kendall, NY (US); Ralph H. Young, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 136 days.

(21) Appl. No.: 10/729,208

(22) Filed: Dec. 5, 2003

(65) Prior Publication Data

US 2005/0121666 A1 Jun. 9, 2005

(51) Int. Cl.
    *H01L 35/24* (2006.01)
(52) U.S. Cl. ........................................ 257/40
(58) Field of Classification Search ................. 257/40; 313/503
    See application file for complete search history.

(56) References Cited

U.S. PATENT DOCUMENTS

| | | | | |
|---|---|---|---|---|
| 5,405,709 | A * | 4/1995 | Littman et al. | 428/690 |
| 6,208,075 | B1 * | 3/2001 | Hung et al. | 313/504 |
| 6,867,538 | B1 * | 3/2005 | Adachi et al. | 313/503 |
| 2002/0025419 | A1 * | 2/2002 | Lee et al. | 428/212 |
| 2002/0034656 | A1 * | 3/2002 | Thompson et al. | 428/690 |
| 2003/0017361 | A1 | 1/2003 | Thompson et al. | |
| 2003/0068528 | A1 * | 4/2003 | Thompson et al. | 428/690 |
| 2003/0137239 | A1 * | 7/2003 | Matsuura et al. | 313/503 |

FOREIGN PATENT DOCUMENTS

| | | |
|---|---|---|
| JP | 2003-092186 | 9/2001 |
| WO | 00/70655 | 11/2000 |
| WO | WO 02/02714 | 10/2002 |
| WO | WO 03/040256 | 5/2003 |
| WO | WO 03/040257 | 5/2003 |

OTHER PUBLICATIONS

M. A. Baldo, et al., "Very high-efficiency Green Organic Light-emitting Devices Based on Electrophosphorescence", Applied Physics Letters, vol. 75, No. 1, pp. 4-6.

T. Tsutsui, et al., "High Quantum Efficiency in Organic Light-Emitting Devices with Iridium-Complex as a Triplet Emissive Center", Jpn. J. Appl. Phys. vol. 38, 1999, pp. L-1502-L-1504.

C. Adachi, et al., "Efficient Electrophosphorescence Using a Doped Ambipolar Conductive Molecular Organic Thin Film", Organic Electronics 2, 2001, pp. 37-43.

T. Watanabe, et al., "Optimization of Driving Lifetime Durability in Organic LED Devices Using Ir Complex", Proceedings of SPIE vol. 4105, 2001, pp. 175-182.

* cited by examiner

*Primary Examiner*—Nathan J. Flynn
*Assistant Examiner*—Benjamin Sandvik
(74) *Attorney, Agent, or Firm*—Arthur E. Kluegel

(57) ABSTRACT

Disclosed is an electroluminescent device comprising a cathode and an anode; and, located therebetween, a light-emitting layer (LEL) comprising a phosphorescent green-light-emitting material and a host material for the light-emitting material, and in a layer adjacent to the LEL on the anode side, an exciton-blocking layer containing a compound having a hole mobility of at least $1\times10^{-3}$ $cm^2V^{-1}s^{-1}$ and a triplet energy exceeding that of the green-light-emitting material of the LEL. Such a device provides useful light emission.

48 Claims, 1 Drawing Sheet

ORGANIC ELECTROLUMINESCENT DEVICES

FIELD OF THE INVENTION

This invention relates to an organic light emitting diode (OLED) an electroluminescent device comprising a cathode and an anode, and, located therebetween, a light-emitting layer (LEL) comprising a phosphorescent green-light-emitting material and a host material for the light-emitting material, and in a layer adjacent to the LEL on the anode side, an exciton-blocking layer containing a compound having a hole mobility of at least $1 \times 10^{-3}$ cm$^2$V$^{-1}$s$^{-1}$ and a triplet energy exceeding that of the green-light-emitting material of the LEL.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322–334, 1969; and Dresner U.S. Pat. No. 3,710,167, issued Jan. 9, 1973. The organic layers in these devices, usually composed of a polycyclic aromatic hydrocarbon, were very thick (much greater than 1 µm). Consequently, operating voltages were very high, often >100V.

More recent organic EL devices include an organic EL element consisting of extremely thin layers (e.g. <1.0 µm) between the anode and the cathode. Herein, the term "organic EL element" encompasses the layers between the anode and cathode. Reducing the thickness lowered the resistance of the organic layer and has enabled devices that operate at much lower voltage. In a basic two-layer EL device structure, described first in U.S. Pat. No. 4,356,429, one organic layer of the EL element adjacent to the anode is specifically chosen to transport holes, and therefore is referred to as the hole-transporting layer, and the other organic layer is specifically chosen to transport electrons and is referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by Tang et al (J. Applied Physics, Vol. 65, Pages 3610–3616, (1989)). The light-emitting layer commonly consists of a host material doped with a guest material, otherwise known as a dopant. Still further, there has been proposed in U.S. Pat. No. 4,769,292 a four-layer EL element comprising a hole-injecting layer (HIL), a hole-transporting layer (HTL), a light-emitting layer (LEL) and an electron transport/injection layer (ETL). These structures have resulted in improved device efficiency.

Many emitting materials that have been described as useful in an OLED device emit light from their excited singlet state by fluorescence. The excited singlet state can be created when excitons formed in an OLED device transfer their energy to the singlet excited state of the dopant. However, it is generally believed that only 25% of the excitons created in an EL device are singlet excitons. The remaining excitons are triplet, which cannot readily transfer their energy to the dopant to produce the singlet excited state of a dopant. This results in a large loss in efficiency since 75% of the excitons are not used in the light emission process.

Triplet excitons can transfer their energy to a dopant if it has a triplet excited state that is low enough in energy. If the triplet state of the dopant is emissive it can produce light by phosphorescence. In many cases singlet excitons can also transfer their energy to lowest singlet excited state of the same dopant. The singlet excited state can often relax, by an intersystem crossing process, to the emissive triplet excited state. Thus, it is possible, by the proper choice of host and dopant, to collect energy from both the singlet and triplet excitons created in an OLED device and to produce a very efficient phosphorescent emission. The term electrophosphorescence is sometimes used to denote electroluminescence wherein the mechanism of luminescence is phosphorescence.

Another process by which excited states of a dopant can be created is a sequential process in which a hole is trapped by the dopant and subsequently recombines with an electron, or an electron is trapped and subsequently recombines with a hole, in either case producing an excited state of the dopant directly. Singlet and triplet states, and fluorescence, phosphorescence, and intersystem crossing are discussed in J. G. Calvert and J. N. Pitts, Jr., *Photochemistry* (Wiley, New York, 1966) and further discussed in publications by S. R. Forrest and coworkers such as M. A. Baldo, D. F. O'Brien, M. E. Thompson, and S. R. Forrest, *Phys. Rev. B*, 60, 14422 (1999) and M. A. Baldo and S. R. Forrest, *Phys. Rev. B*, 62, 10956 (2000). The singular term "triplet state" is often used to refer to a set of three electronically excited states of spin 1 that have nearly identical electronic structure and nearly identical energy and differ primarily in the orientation of the net magnetic moment of each state. A molecule typically has many such triplet states with widely differing energies. As used hereinafter, the term "triplet state" of a molecule will refer specifically to the set of three spin-1 excited states with the lowest energy, and the term "triplet energy" will refer to the energy of these states relative to the energy of the ground state of the molecule.

One class of useful phosphorescent materials is the transition metal complexes having singlet ground states and triplet excited states. For example, fac-tris(2-phenylpyridinato-N,C$^{2'}$)iridium(III) (Ir(ppy)$_3$) strongly emits green light from a triplet excited state owing to, first, the large spin-orbit coupling of the heavy atom and, second, the nature of the lowest excited state, which is a charge transfer state having a Laporte allowed (orbital-symmetry-allowed) transition to the ground state (K. A. King, P. J. Spellane, and R. J. Watts, *J. Am. Chem. Soc.*, 107, 1431 (1985), M. G. Colombo, T. C. Brunold, T. Reidener, H. U. Güdel, M. Fortsch, and H.-B. Bürgi, *Inorg. Chem.*, 33, 545 (1994)). Small-molecule, vacuum-deposited OLEDs having high efficiency have also been demonstrated with Ir(ppy)$_3$ as the phosphorescent material and 4,4'-N,N'-dicarbazole-biphenyl (CBP) as the host (M. A. Baldo, S. Lamansky, P. E. Burrows, M. E. Thompson, and S. R. Forrest, *Appl. Phys. Lett.*, 75, 4 (1999), T. Tsutsui, M.-J. Yang, M. Yahiro, K. Nakamura, T. Watanabe, T. Tsuji, Y. Fukuda, T. Wakimoto, and S. Miyaguchi, *Jpn. J. Appl. Phys.*, 38, L1502 (1999)). LeCloux et al. in International Patent Application WO 03/040256 A2, and Petrov et al. in International Patent Application WO 02/02714 A2 teach additional iridium complexes for electroluminescent devices.

Another class of phosphorescent materials includes compounds having interactions between atoms having a $d^{10}$ electron configuration, such as $Au_2(dppm)Cl_2$, where dppm is bis(diphenylphosphino)methane) (Y. Ma et al., *Appl. Phys. Lett.*, 74, 1361 (1998)). Still other examples of useful phosphorescent materials include coordination complexes of the trivalent lanthanides such as $Tb^{3+}$ and $Eu^{3+}$ (J. Kido et al., *Appl. Phys. Lett.*, 65, 2124 (1994)). While these latter phosphorescent compounds do not necessarily have triplets as the lowest excited states, their optical transitions do involve a change in spin state of 1 and thereby can harvest the triplet excitons in OLED devices.

In addition to suitable hosts, an OLED device employing a phosphorescent material may include at least one exciton-blocking layer, placed adjacent to light-emitting layer on the anode side, to help confine the electron-hole recombination events and the resulting excitons to the light-emitting layer comprising the host and phosphorescent material. This feature can further improve the efficiency of the device. A hole-transporting layer can also function simultaneously as an exciton-blocking layer if its energy levels have suitable values. Examples of hole-transporting materials whose energy levels make them suitable for use with many phosphorescent materials include 4,4',4"-tris(N-3-methylphenyl-N-phenylamino)triphenylamine (MTDATA; see JP2003092186A) and bis[4-(N,N-diethylamino)-2-methylphenyl](4-methylphenyl)methane (MPMP; see WO02/02714 and WO03/040257). However, these materials do not give the optimum performance possible in an electroluminescent device.

Notwithstanding these developments, there remains a need to provide OLEDs exhibiting useful light emission.

SUMMARY OF THE INVENTION

The invention provides an electroluminescent device comprising a cathode and an anode, and, located therebetween, a light-emitting layer (LEL) comprising a phosphorescent green-light-emitting material and a host material for the light-emitting material, and in a layer adjacent to the LEL on the anode side, an exciton-blocking layer containing a compound having a hole mobility of at least $1 \times 10^{-3}$ $cm^2V^{-1}s^{-1}$ and a triplet energy exceeding that of the green-light-emitting material of the LEL. The invention also provides a display and an area lighting device containing the device and a process for emitting light using the device.

Such a device provides useful light emission.

DETAILED DESCRIPTION OF THE INVENTION

Figure 1:
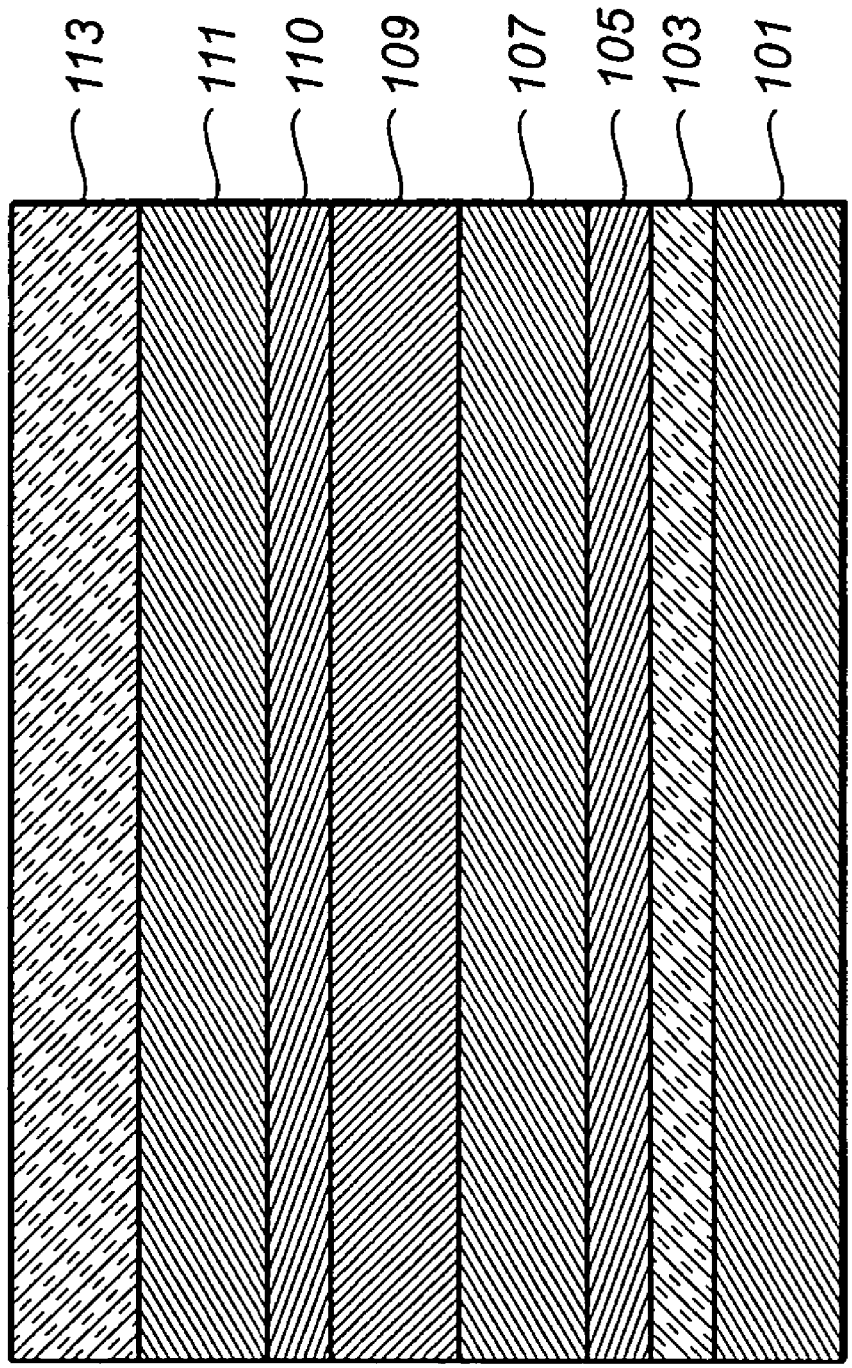
FIG. 1 shows a cross-section of a schematic of a typical OLED device in which this invention may be used.

The electroluminescent device is summarized above. The device can also include a hole-injecting layer, a hole-transporting layer, a hole-blocking layer, an electron-transporting layer, or more than one of these optional layers. In some embodiments, the light-emitting layer is conveniently a green-light-emitting layer. In some suitable embodiments the device includes a hole-injecting layer.

According to the present invention, the light-emitting layer 109 of the EL device comprises a host material, one or more guest materials for emitting light, and an efficiency-enhancing material whose nature will become evident. At least one of the guest materials is a phosphorescent complex such as one comprising an organometallic compound including a 5th-row transition element, e.g. platinum or iridium as more fully described hereafter.

Suitable host materials should preferably be selected so that transfer of a triplet exciton can occur efficiently from the host material to the phosphorescent guest material but cannot occur efficiently from the phosphorescent material to the host material. Therefore, it is highly desirable that the triplet energy of the phosphorescent material be lower than the triplet energy of the host. Generally speaking, a large triplet energy implies a large optical bandgap. However, the band gap of the host should not be chosen so large as to cause an unacceptable barrier to injection of charge carriers into the light-emitting layer and an unacceptable increase in the drive voltage of the OLED. Suitable host materials are described in WO 00/70655 A2; 01/39234 A2; 01/93642 A1; 02/074015 A2; 02/15645 A1; and U.S. 20020117662. Suitable hosts include certain aryl amines, triazoles, indoles and carbazole compounds. Examples of desirable hosts are 4,4'-bis(carbazol-9-yl)biphenyl (CBP), 4,4'-bis(carbazol-9-yl)-2,2'-dimethyl-biphenyl (CDBP), 1,3-bis(carbazol-9-yl)benzene, and poly(N-vinylcarbazole), including their derivatives.

In addition, desirable host materials may be hole- and electron-transporting, that is, they may allow the transport of both holes and electrons. Carbazole containing compounds such as CBP (see C. Adachi et al., *Organic Electronics*, 2, 37–43 (2001)) can serve as both hole- and electron-transporting host materials. Suitable host materials include carbazole derivatives such as those represented by Formula 1.

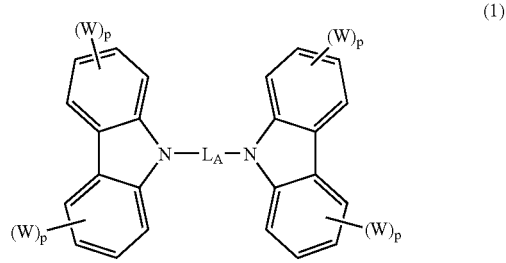

(1)

In Formula 1, W independently represents hydrogen or an independently selected substituent, such as a methyl group, p independently is 0–4, and $L_A$ represents a linking group. Suitable linking groups include arylene groups such as phenylene or biphenylene groups, or aliphatic or alicyclic groups such as 1,3-propyl or 1,3-cyclobutyl. Particularly suitable are compounds of Formula 1 wherein W and $L_A$ do not contain additional fused rings such as naphthalene rings. Examples include the following:

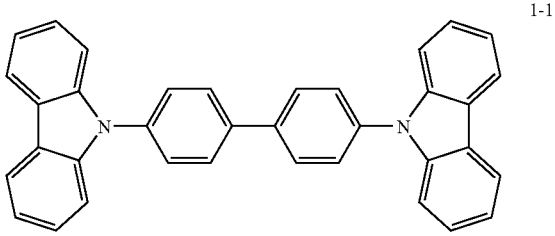

1-1

-continued

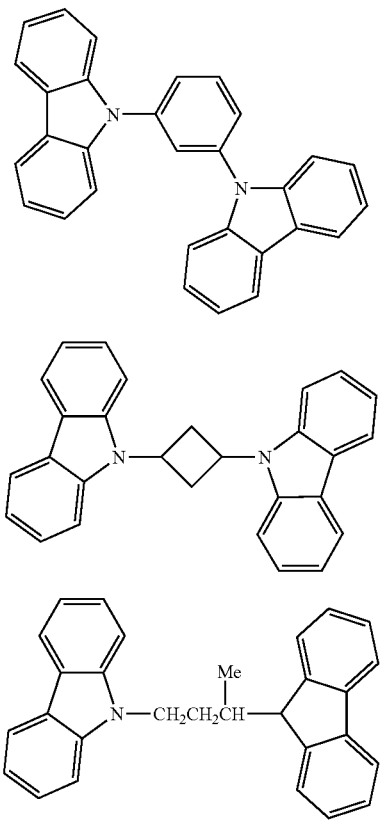

1-2

1-3

1-4

The light-emitting layer may contain more than one host material in order to improve the device's film morphology, electrical properties, light emission efficiency, and lifetime. The light-emitting layer may contain a first host material that has good hole-transporting properties, and a second host material that has good electron-transporting properties, which together can form a hole- and electron-transporting host material.

As described previously, an OLED device employing a phosphorescent material may include at least one exciton-blocking layer, 108 (FIG. 1), placed adjacent to light-emitting layer 109 on the anode side, to help confine the electron-hole recombination events and the resulting excitons to the light-emitting layer 109 comprising the host and phosphorescent material. In order that the exciton-blocking layer be capable of confining triplet excitons, the material or materials of the exciton-blocking layer should have triplet energies that exceed that of the phosphorescent material. Triplet energy is conveniently measured by any of several means, as discussed for instance in S. L. Murov, I. Carmichael, and G. L. Hug, *Handbook of Photochemistry*, 2nd ed. (Marcel Dekker, New York, 1993). The exciton-blocking layer 108 must be capable of transporting holes to the light-emitting layer 109.

We have found that it is highly desirable to select a exciton-blocking material, that in addition to having a high triplet energy, also has a hole mobility of at least $1\times10^{-1}$ $cm^2V^{-1}s^{-1}$. In one suitable embodiment, the exciton-blocking material, in addition to having a high triplet energy, has a hole mobility of at least $5\times10^{-3}$ $cm^2V^{-1}s^{-1}$. Hole mobility is defined loosely as the average velocity of holes when they drift under the influence of an electric field. The value of the hole mobility in an amorphous organic material generally depends on the electric field strength and the temperature. Moreover, even a single measurement in a given sample under given conditions typically exhibits a rather broad distribution of individual velocities, believed to be a consequence of the disordered nature of the material. Therefore, a quantitative statement about the mobility must be based on a specific definition of the experimental measurement and the interpretation used to evaluate the mobility. For purposes of this disclosure, the mobility of holes is evaluated in a time-of-flight experiment at room temperature, using a sample of thickness between about 0.2 and 20 μm, an electric field strength of $1\times10^5$ V/cm, and defining the average velocity by the crossing-of tangents method. An example of the experimental measurement technique and the crossing-of-tangents method is provided by J. X. Mack et al., *Phys. Rev.* B 39, 7500 (1989). Additional information on hole mobility is provided by P. M. Borsenberger and D. S. Weiss, *Organic Photoreceptors for Xerography* (Marcel Dekker, New York 1998).

The exciton-blocking layer can be between 1 and 300 nm thick and suitably between 10 and 300 nm thick. Thicknesses in this range are relatively easy to control in manufacture. If the exciton-blocking layer 108 is much thicker than 10 nm, it is desirable that the mobility of holes in this layer be relatively high in order to minimize the drive voltage of the device. As is well known from the theory of space-charge-limited currents, a low hole mobility results in the presence of space charge in such a layer when a hole current is driven through it, and the result is a high electric field and a large voltage drop across the layer. Generally speaking, if the exciton-blocking layer is no thicker than about 100 nm, a hole mobility of about $1\times10^4$ $cm^2V^{-1}s^{-1}$ is desirable to minimize the drive voltage, but a further increase in the mobility cannot further diminish the drive voltage by more than about 1V. If the exciton-blocking layer is thin, say <10 nm, a high hole mobility is less important for purposes of minimizing the drive voltage. However, and surprisingly, we have found that the luminous yield and power efficiency of an OLED device employing a phosphorescent material can be increased by use of certain hole-transporting materials in the exciton-blocking layer. The hole-transporting materials are characterized by extremely high values of the hole mobility and, in addition, high triplet energies. Thus, the exciton-blocking layer of the present invention includes a hole-transporting material with a triplet energy exceeding the triplet energy of the phosphorescent material and a hole mobility of at least $1\times10^{-3}$ $cm^2V^{-1}s^{-1}$.

This hole-transporting material can comprise compounds containing one or more triarylamine groups wherein no multiple-ring (e.g. biphenyl, terphenyl) or fused-ring (e.g. naphthalene, fluorene) systems are attached simultaneously to the nitrogen atoms of two or more triarylamine groups and wherein the triplet energy exceeds that of the phosphorescent material. The triarylamine groups are preferably distinct meaning that they do not share a common aryl group. The use of these materials also results in a decreased drive voltage. Examples of materials useful in the exciton-blocking layer 108 include, but are not limited to:

1,1-Bis(4-(N,N-di-p-tolylamino)phenyl)cyclohexane (TAPC)

1,1-Bis(4-(N,N-di-p-tolylamino)phenyl)-4-phenylcyclohexane 1,1-Bis(4-(N,N-di-p-tolylamino)phenyl)-4-methylcyclohexane 1,1-Bis(4(N,N-di-p-tolylamino)phenyl)-3-phenylpropane.

An exemplary material that satisfies the above structural and hole-mobility requirements of the present invention is TAPC. The triplet energy is approximately equal to that of the structurally related compound, triphenylamine, namely 3.0 eV (S. L. Murov, I. Carmichael, and G. L. Hug, *Handbook of Photochemistry*, 2$^{nd}$ ed. (Marcel Dekker, New York, 1993)). The triplet energy of a green phosphorescent material is typically less than 2.5 eV, and the triplet energy of a blue phosphorescent material can be as low as 2.8 eV. Thus, TAPC meets the requirement that the triplet energy of the exciton-blocking layer exceed that of the phosphorescent material provided that it is used with a green phosphorescent material or a blue phosphorescent material whose triplet energy is below 3.0 eV. The requirement is also met if the triplet energy of the phosphorescent material is yet lower, as is usually the case if the characteristic phosphorescence is yellow, orange, red. The hole mobility in TAPC, under the conditions stated above, is about $7 \times 10^{-1}$ cm$^2$V$^{-1}$s$^{-1}$ (P. M. Borsenberger, *J. Chem. Phys.* 94, 8276 (1991)) and therefore meets the requirements of the present invention. Additional materials that satisfy the above structural, triplet-energy, and hole-mobility requirements of the present invention are triarylamine compounds such as 1,1-bis(4-(N,N-di-p-tolylamino)phenyl)-4-phenylcyclohexane, 1,1-bis(4-(N,N-di-p-tolylamino)phenyl)-4-methylcyclohexane, and 1,1-bis(4-(N,N-di-p-tolylamino)phenyl)-3-phenylpropane. An example of a material that fails to satisfy the structural requirements is NPB. The hole mobility in NPB, under the conditions stated above, is about $5 \times 10^{-4}$ cm$^2$V$^{-1}$s$^{-1}$ (B. Chen et al., *Jpn. J. Appl. Phys.* 39, 1190 (2000)) and also fails to meet the requirements of the present invention. Additional examples of materials that do not meet the requirements of the present invention include MPMP and MTDATA. The triplet energy of MPMP is approximately equal to that of the structurally related compound, N,N-dimethylaniline, namely 3.3 eV. This value is sufficiently high for use with most phosphorescent materials. However, the hole mobility under the conditions stated above, $3 \times 10^{-4}$ cm$^2$V$^{-1}$s$^{-1}$ (evaluated from parameters in Table II of P. M. Borsenberger et al., *Jpn J. Appl. Phys.* 35, 2698 (1996)), is too low. The hole mobility in MTDATA, under the conditions stated above, is $3 \times 10^{-5}$ cm$^2$V$^{-1}$s$^{-1}$ (C. Giebeler et al., *Appl. Phys. Lett,* 72, 2448 (1998)) is also too low.

In one suitable embodiment the exciton blocking material comprises a material of Formula (2).

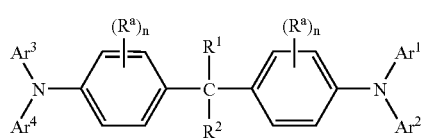

(2)

In Formula (2), R$^1$ and R$^2$ represent hydrogen or substituents, provided that R$^1$ and R$^2$ can join to form a ring. For example R$^1$ and R$^2$ can be methyl groups or join to form a cyclohexyl ring group. Ar$^1$–Ar$^4$ represent independently selected aromatic groups, for example phenyl groups or tolyl groups. R$^a$ represents hydrogen or an independently selected substituent, and n is independently selected as 0–4. In one suitable embodiment, R$^1$, R$^2$, and R$^a$ represent hydrogen or independently selected hydrocarbon groups, provided that R$^1$ and R$^2$ can join to form a hydrocarbon ring. Desirably, R$^1$, R$^2$, R$^a$, and Ar$^1$–Ar$^4$ do not contain fused aromatic rings.

Exciton-blocking layer 108 can be used alone or with a known hole-transporting layer 107.

An exciton-blocking layer as described here has been found to provide improved efficiency. In one embodiment, an exciton-blocking layer is used with a light-emitting layer comprising a phosphorescent green-light-emitting material and a host for the light-emitting material. In another embodiment, an exciton-blocking layer is used with a light-emitting layer comprising a phosphorescent light-emitting material and a host for the light-emitting material, and a hole-injecting layer adjacent to the anode. Conveniently, the hole-injecting layer includes a plasma-deposited fluorocarbon polymer as described in U.S. Pat. No. 6,208,075. In a further embodiment, an exciton-blocking layer is used with a light-emitting layer comprising a phosphorescent light-emitting material and a host for the light-emitting material, and a hole-blocking layer 110 on the cathode side of the light-emitting layer. In one suitable embodiment the phosphorescent light-emitting material is an organometallic compound that includes a ligand that can be coordinated to a metal through an sp$^2$ carbon and a heteroatom, such as a phenylpyridine or a derivative thereof. Illustrative examples of organometallic compounds are tris(2-phenylpyridinato-N,C$^{2'}$)iridium(III), bis(2-phenylpyridinato-N,C$^{2'}$)iridium (III)(acetylacetonate), and bis(2-phenylpyridinato-N,C$^{2'}$) platinum(II).

In one suitable embodiment the EL device includes a means for emitting white light, which may include complimentary emitters, a white emitter, or a filtering means. The device may also include a fluorescent emitting material.

In one desirable embodiment the EL device is part of a display device. In another suitable embodiment the EL device is part of an area lighting device.

Unless otherwise specifically stated, use of the term "substituted" or "substituent" means any group or atom other than hydrogen. Unless otherwise provided, when a group (including a compound or complex) containing a substitutable hydrogen is referred to, it is also intended to encompass not only the unsubstituted form, but also form further substituted derivatives with any substituent group or groups as herein mentioned, so long as the substituent does not destroy properties necessary for utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy)propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxopyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron. such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain the desired desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

General Device Architecture

The present invention can be employed in many OLED device configurations using small molecule materials, oligomeric materials, polymeric materials, or combinations thereof. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. The essential requirements of an OLED are an anode, a cathode, and an organic light-emitting layer located between the anode and cathode. Additional layers may be employed as more fully described hereafter.

A typical structure according to the present invention and especially useful for a small molecule device, is shown in FIG. 1 and is comprised of a substrate 101, an anode 103, a hole-injecting layer 105, a hole-transporting layer 107, an exciton-blocking layer 108, a light-emitting layer 109, a hole-blocking layer 110, an electron-transporting layer 111, and a cathode 113. These layers are described in detail below. Note that the substrate 101 may alternatively be located adjacent to the cathode 113, or the substrate 101 may actually constitute the anode 103 or cathode 113. The organic layers between the anode 103 and cathode 113 are conveniently referred to as the organic EL element. Also, the total combined thickness of the organic layers is desirably less than 500 nm.

The anode 103 and cathode 113 of the OLED are connected to a voltage/current source through electrical conductors. The OLED is operated by applying a potential between the anode 103 and cathode 113 such that the anode 103 is at a more positive potential than the cathode 113. Holes are injected into the organic EL element from the anode 103 and electrons are injected into the organic EL element at the cathode 113. Enhanced device stability can sometimes be achieved when the OLED is operated in an AC mode where, for some time period in the AC cycle, the potential bias is reversed and no current flows. An example of an AC driven OLED is described in U.S. Pat. No. 5,552,678.

Substrate

The OLED device of this invention is typically provided over a supporting substrate 101 where either the cathode 113 or anode 103 can be in contact with the substrate. The electrode in contact with the substrate 101 is conveniently referred to as the bottom electrode. Conventionally, the bottom electrode is the anode 103, but this invention is not limited to that configuration. The substrate 101 can either be light transmissive or opaque, depending on the intended direction of light emission. The light transmissive property is desirable for viewing the EL emission through the substrate 101. Transparent glass or plastic is commonly employed in such cases. The substrate 101 can be a complex structure comprising multiple layers of materials. This is typically the case for active matrix substrates wherein TFTs are provided below the OLED layers. It is still necessary that the substrate 101, at least in the emissive pixelated areas, be comprised of largely transparent materials such as glass or polymers. For applications where the EL emission is viewed through the top electrode, the transmissive characteristic of the bottom support is immaterial, and therefore the substrate can be light transmissive, light absorbing or light reflective. Substrates for use in this case include, but are not limited to, glass, plastic, semiconductor materials such as silicon, ceramics, and circuit board materials. Again, the substrate 101 can be a complex structure comprising multiple layers of materials such as found in active matrix TFT designs. It is necessary to provide in these device configurations a light-transparent top electrode.

Anode

When the desired electroluminescent light emission (EL) is viewed through the anode, the anode 103 should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode 103. For applications where EL emission is viewed only through the cathode 113, the transmissive characteristics of the anode 103 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize short circuits or enhance reflectivity.

Cathode

When light emission is viewed solely through the anode 103, the cathode 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One useful cathode material is comprised of a Mg:Ag alloy wherein the percentage of silver is in the range of 1 to 20%, as described in U.S. Pat. No. 4,885,221. Another suitable class of cathode materials includes bilayers comprising the cathode and a thin electron-injection layer (EIL) in contact with an organic layer (e.g., an electron transporting layer (ETL)), the cathode being capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. An ETL material doped with an alkali metal, for example, Li-doped Alq, is another example of a useful EIL. Other useful cathode material sets include, but are not limited to, those disclosed in U.S. Pat. Nos. 5,059,861, 5,059,862, and 6,140,763.

When light emission is viewed through the cathode, the cathode 113 must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234,963, U.S. Pat. No. 5,703,436, U.S. Pat. No. 5,608,287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, U.S. Pat. No. 6,278,236, and U.S. Pat. No. 6,284,3936. Cathode materials are typically deposited by any suitable method such as evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Hole-Injecting Layer (HIL)

A hole-injecting layer 105 may be provided between anode 103 and hole-transporting layer 107. The hole-injecting layer can serve to improve the film formation property of subsequent organic layers and to facilitate injection of holes into the hole-transporting layer 107. Suitable materials for use in the hole-injecting layer 105 include, but are not limited to, porphyrinic compounds as described in U.S. Pat. No. 4,720,432, plasma-deposited fluorocarbon polymers as described in U.S. Pat. No. 6,208,075, and some aromatic amines, for example, MTDATA (4,4',4"-tris[(3-methylphenyl)phenylamino]triphenylamine). Alternative hole-injecting materials reportedly useful in organic EL devices are described in EP 0 891 121 A1 and EP 1 029 909 A1. A hole-injection layer is conveniently used in the present invention, and is desirably a plasma-deposited fluorocarbon polymer. The thickness of a hole-injection layer containing a plasma-deposited fluorocarbon polymer can be in the range of 0.2 nm to 15 nm and suitably in the range of 0.3 to 1.5 nm.

Hole-Transporting Layer (HTL)

While not always necessary, it is often useful to include a hole-transporting layer in an OLED device. The hole-transporting layer 107 of the organic EL device contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. No. 3,567,450 and U.S. Pat. No. 3,658,520.

A more preferred class of aromatic tertiary amines is those which include at least two aromatic tertiary amine moieties as described in U.S. Pat. No. 4,720,432 and U.S. Pat. No. 5,061,569. Such compounds include those represented by structural formula (A).

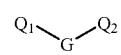

A wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

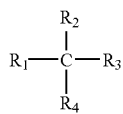

B where
$R_1$ and $R_2$ each independently represents a hydrogen atom, an aryl group, or an alkyl group or $R_1$ and $R_2$ together represent the atoms completing a cycloalkyl group; and
$R_3$ and $R_4$ each independently represents an aryl group, which is in turn substituted with a diaryl substituted amino group, as indicated by structural formula (C):

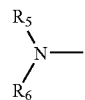

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines is the tetraaryldiamines. Desirable tetraaryldiamines include two diarylamino groups, such as indicated by formula (C), linked through an arylene group. Useful tetraaryldiamines include those represented by formula (D).

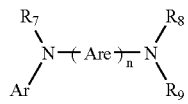

D wherein
each Are is an independently selected arylene group, such as a phenylene or anthracene moiety,
n is an integer of from 1 to 4, and
Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halide such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single tertiary amine compound or a mixture of such compounds. Specifically, one may employ a triarylamine, such as a triarylamine satisfying the formula (B), in combination with a tetraaryldiamine, such as indicated by formula (D). Illustrative of useful aromatic tertiary amines are the following:
1,1-Bis(4-di-p-tolylaminophenyl)cyclohexane (TAPC)
1,1-Bis(4-di-p-tolylaminophenyl)-4-methylcyclohexane
1,1-Bis(4-di-p-tolylaminophenyl)-4-phenylcyclohexane
1,1-Bis(4-di-p-tolylaminophenyl)-3-phenylpropane (TAPPP)
N,N,N',N'-tetraphenyl-4,4'''-diamino-1,1':4',1'':4'',1'''-quaterphenyl
Bis(4-dimethylamino-2-methylphenyl)phenylmethane
1,4-bis[2-[4-[N,N-di(p-toly)amino]phenyl]vinyl]benzene (BDTAPVB)
N,N,N',N'-Tetra-p-tolyl-4,4'-diaminobiphenyl (TTB)
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl (NPB)
4,4'-Bis[N-(1-naphthyl)-N-(2-naphthyl)amino]biphenyl (TNB)
4,4'-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4'-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4''-diamino-p-terphenyl
4,4'-Bis{N-phenyl-N-[4-(1-naphthyl)-phenyl]amino}biphenyl
2,6-Bis[N,N-di(2-naphthyl)amino]fluorene
4,4',4''-tris[(3-methylphenyl)phenylamino]triphenylamine (MTDATA)
4,4'-Bis[N-(3-methylphenyl)-N-phenylamino]biphenyl (TPD)

Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS. It is also possible for the hole-transporting layer to comprise two or more sublayers of differing compositions, the composition of each sublayer being as described above. The thickness of the hole-transporting layer can be between 10 and about 500 nm and suitably between 50 and 300 nm.

Exciton-Blocking Layer (EBL)
The exciton-blocking layer has been described previously.

Light-Emitting Layer (LEL)
Suitably, the light-emitting layer 109 of the OLED device comprises a host material and one or more guest materials for emitting light. At least one of the guest materials is suitably a phosphorescent complex comprising an organometallic compound including a 5th-row transition element, e.g. platinum or iridium. The light-emitting guest material(s) is typically present in an amount of from 1 to 20 wt % of the light-emitting layer, and conveniently from 3 to 7 wt % of the light-emitting layer. For convenience, the phosphorescent complex guest material may be referred to herein as a phosphorescent material. The phosphorescent material typically includes one or more ligands, for example monoanionic ligands that can be coordinated to a metal through an $sp^2$ carbon and a heteroatom. Conveniently, the ligand can be phenylpyridine (ppy) or derivatives or analogs thereof. Examples of some useful phosphorescent organometallic materials include tris(2-phenylpyridinato-N,$C^{2'}$)iridium(III), bis(2-phenylpyridinato-N,$C^{2'}$)iridium(III)(acetylacetonate), and bis(2-phenylpyridinato-N,$C^{2'}$)platinum(II). Usefully, many phosphorescent organometallic materials emit in the green region of the spectrum, that is, with a maximum emission in the range of 510 to 570 nm.

Phosphorescent materials may be used singly or in combinations other phosphorescent materials, either in the same or different layers. Phosphorescent materials and suitable hosts are described in WO 00/57676, WO 00/70655, WO 01/41512 A1, WO 02/15645 A1, U.S. 2003/0017361 A1, WO 01/93642 A1, WO 01/39234 A2, U.S. Pat. No. 6,458,475 B1, WO 02/071813 A1, U.S. Pat. No. 6,573,651 B2, U.S. 2002/0197511 A1, WO 02/074015 A2, U.S. Pat. No. 6,451,455 B1, U.S. 2003/0072964 A1, U.S. 2003/0068528 A1, U.S. Pat. No. 6,413,656 B1, U.S. Pat. No. 6,515,298 B2, U.S. Pat. No. 6,451,415 B1, U.S. Pat. No. 6,097,147, U.S. 2003/0124381 A1, U.S. 2003/0059646 A1, U.S. 2003/0054198 A1, EP 1 239 526 A2, EP 1 238 981 A2, EP 1 244 155 A2, U.S. 2002/0100906 A1, U.S. 2003/0068526 A1, U.S. 2003/0068535 A1, JP 2003073387A, JP 2003 073388A, U.S. 2003/0141809 A1, U.S. 2003/0040627 A1, JP 2003059667A, JP 2003073665A, and U.S. 2002/0121638 A1.

The emission wavelengths of cyclometallated Ir(III) complexes of the type $IrL_3$ and $IrL_2L'$, such as the green-emitting fac-tris(2-phenylpyridinato-N,$C^{2'}$)iridium(III) and bis(2-phenylpyridinato-N,$C^{2'}$)iridium(II)(acetylacetonate) may be shifted by substitution of electron donating or withdrawing groups at appropriate positions on the cyclometallating ligand L, or by choice of different heterocycles for the cyclometallating ligand L. The emission wavelengths may also be shifted by choice of the ancillary ligand L'. Examples of red emitters are the bis(2-(2'-benzothienyl)pyridinato-N,$C^{3'}$)iridium(III)(acetylacetonate) and tris(2-phenylisoquinolinato-N,C)iridium(III). A blue-emitting example is bis(2-(4,6-difluorophenyl)-pyridinato-N,$C^{2'}$)iridium(III) (picolinate).

Red electrophosphorescence has been reported, using bis(2-(2'-benzo[4,5-a]thienyl)pyridinato-N,$C^3$) iridium (acetylacetonate) [$Btp_2Ir(acac)$] as the phosphorescent material (C. Adachi, S. Lamansky, M. A. Baldo, R. C. Kwong, M. E. Thompson, and S. R. Forrest, *App. Phys. Lett.*, 78, 1622–1624 (2001)).

Other important phosphorescent materials include cyclometallated Pt(II) complexes such as cis-bis(2-phenylpyridinato-N,$C^{2'}$)platinum(II), cis-bis(2-(2'-thienyl)pyridinato-N,$C^{3'}$) platinum(II), cis-bis(2-(2'-thienyl)quinolinato-N,$C^{5'}$) platinum(II), or (2-(4,6-difluorophenyl)pyridinato-N,$C^{2'}$) platinum (II) (acetylacetonate). Pt (II) porphyrin complexes such as 2,3,7,8,12,13,17,18-octaethyl-21H,23H-porphine platinum(II) are also useful phosphorescent materials.

Still other examples of useful phosphorescent materials include coordination complexes of the trivalent lanthanides such as $Tb^{3+}$ and $Eu^{3+}$ (J. Kido et al., *Appl. Phys. Lett.*, 65, 2124 (1994)).

Suitable host materials have ben described earlier and should be selected so that transfer of a triplet exciton can occur efficiently from the host material to the phosphorescent material but cannot occur efficiently from the phosphorescent material to the host material. Therefore, it is highly desirable that the triplet energy of the phosphorescent material be lower than the triplet energy of the host. Generally speaking, a large triplet energy implies a large optical bandgap. However, the band gap of the host should not be chosen so large as to cause an unacceptable barrier to injection of charge carriers into the light-emitting layer and an unacceptable increase in the drive voltage of the OLED. Suitable host materials are described in WO 00/70655 A2; 01/39234 A2; 01/93642 A1; 02/074015 A2; 02/15645 A1, and U.S. 20020117662. Suitable hosts include certain aryl amines, triazoles, indoles and carbazole compounds. Examples of desirable hosts are 4,4'-N,N'-dicarbazole-biphenyl, otherwise known as 4,4'-bis(carbazol-9-yl)biphenyl or CBP; 4,4'-N,N'-dicarbazole-2,2'-dimethyl-biphenyl, otherwise known as 2,2'-dimethyl-4,4'-bis(carbazol-9-yl)biphenyl or CDBP; 1,3-bis(N,N'-dicarbazole)benzene, otherwise known as 1,3-bis(carbazol-9-yl)benzene, and poly(N-vinylcarbazole), including their derivatives.

Desirable host materials are capable of forming a continuous film.

Fluorescent Light-Emitting Materials and Layers (LEL)

In addition to the phosphorescent materials of this invention, other light emitting materials may be used in the OLED device, including fluorescent materials. Although the term "fluorescent" is commonly used to describe any light emitting material, in this case we are referring to a material that emits light from a singlet excited state. Fluorescent materials may be used in the same layer as the phosphorescent material, in adjacent layers, in adjacent pixels, or any combination. Care must be taken not to select materials that will adversely affect the performance of the phosphorescent materials of this invention. One skilled in the art will understand that concentrations and triplet energies of materials in the same layer as the phosphorescent material or in an adjacent layer must be appropriately set so as to prevent unwanted quenching of the phosphorescence.

As more fully described in U.S. Pat. Nos. 4,769,292 and 5,935,721, the light-emitting layer (LEL) of the organic EL element includes a luminescent fluorescent or phosphorescent material where electroluminescence is produced as a result of electron-hole pair recombination. The light-emitting layer can be comprised of a single material, but more commonly consists of a host material doped with a guest emitting material or materials where light emission comes primarily from the emitting materials and can be of any color. The host materials in the light-emitting layer can be an electron-transporting material, as defined below, a hole-transporting material, as defined above, or another material or combination of materials that support hole-electron recombination. Fluorescent emitting materials are typically incorporated at 0.01 to 10% by weight of the host material.

The host and emitting materials can be small non-polymeric molecules or polymeric materials such as polyfluorenes and polyvinylarylenes (e.g., poly(p-phenylenevinylene), PPV). In the case of polymers, small-molecule emitting materials can be molecularly dispersed into a polymeric host, or the emitting materials can be added by copolymerizing a minor constituent into a host polymer. Host materials may be mixed together in order to improve film formation, electrical properties, light emission efficiency, operating lifetime, or manufacturability. The host may comprise a material that has good hole-transporting properties and a material that has good electron-transporting properties.

An important relationship for choosing a fluorescent material as a guest emitting material is a comparison of the excited singlet-state energies of the host and the fluorescent material. It is highly desirable that the excited singlet-state energy of the fluorescent material be lower than that of the host material. The excited singlet-state energy is defined as the difference in energy between the emitting singlet state and the ground state. For non-emissive hosts, the lowest excited state of the same electronic spin as the ground state is considered the emitting state.

Host and emitting materials known to be of use include, but are not limited to, those disclosed in U.S. Pat. No. 4,768,292, U.S. Pat. No. 5,141,671, U.S. Pat. No. 5,150,006, U.S. Pat. No. 5,151,629, U.S. Pat. No. 5,405,709, U.S. Pat. No. 5,484,922, U.S. Pat. No. 5,593,788, U.S. Pat. No. 5,645,948, U.S. Pat. No. 5,683,823, U.S. Pat. No. 5,755,999, U.S. Pat. No. 5,928,802, U.S. Pat. No. 5,935,720, U.S. Pat. No. 5,935,721, and U.S. Pat. No. 6,020,078.

Metal complexes of 8-hydroxyquinoline and similar derivatives, also known as metal-chelated oxinoid compounds (Formula E), constitute one class of useful host compounds capable of supporting electroluminescence, and are particularly suitable for light emission of wavelengths longer than 500 nm, e.g., green, yellow, orange, and red.

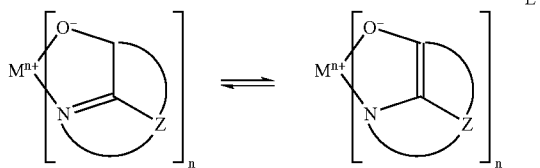

wherein
M represents a metal;
n is an integer of from 1 to 4; and
Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; a trivalent metal, such aluminum or gallium, or another metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:
CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato)zirconium(IV)]

Derivatives of 9,10-di-(2-naphthyl)anthracene (Formula F) constitute one class of useful host materials capable of supporting electroluminescence, and are particularly suitable for light emission of wavelengths longer than 400 nm, e.g., blue, green, yellow, orange or red.

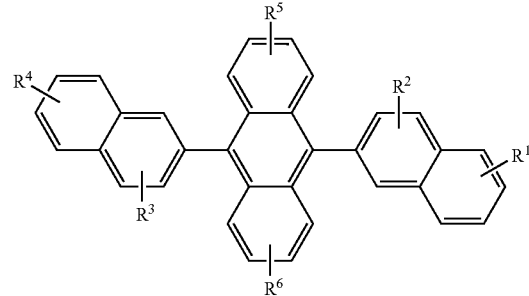

wherein: $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Illustrative examples include 9,10-di-(2-naphthyl)anthracene and 2-t-butyl-9,10-di-(2-naphthyl)anthracene. Other anthracene derivatives can be useful as a host in the LEL, including derivatives of 9,10-bis[4-(2,2-diphenylethenyl)phenyl]anthracene.

Benzazole derivatives (Formula G) constitute another class of useful host materials capable of supporting electroluminescence, and are particularly suitable for light emission of wavelengths longer than 400 nm, e.g., blue, green, yellow, orange or red.

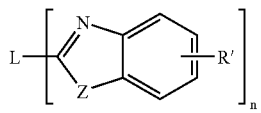

G wherein:

n is an integer of 3 to 8;

Z is O, NR or S; and

R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and L is a linkage unit consisting of alkyl, aryl, substituted alkyl, or substituted aryl, which connects the multiple benzazoles together. L may be either conjugated with the multiple benzazoles or not in conjugation with them. An example of a useful benzazole is 2,2',2''-(1,3,5-phenylene) tris[1-phenyl-1H-benzimidazole].

Styrylarylene derivatives as described in U.S. Pat. No. 5,121,029 and JP 08333569 are also useful hosts for blue emission. For example, 9,10-bis[4-(2,2-diphenylethenyl) phenyl]anthracene and 4,4'-bis(2,2-diphenylethenyl)-1,1'-biphenyl (DPVBi) are useful hosts for blue emission.

Useful fluorescent emitting materials include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrylium and thiapyrylium compounds, fluorene derivatives, periflanthene derivatives, indenoperylene derivatives, bis(azinyl)amine boron compounds, bis(azinyl)methane compounds, and carbostyryl compounds. Illustrative examples of useful materials include, but are not limited to, the following:

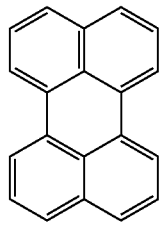

L1

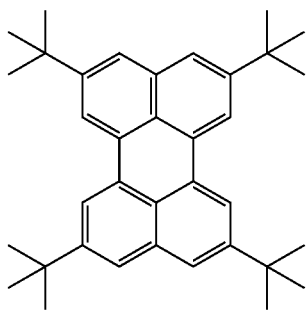

L2

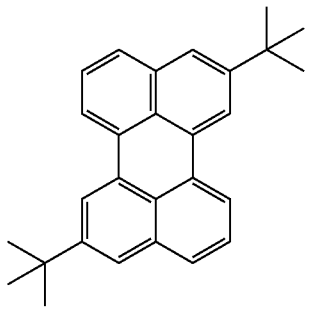

L3

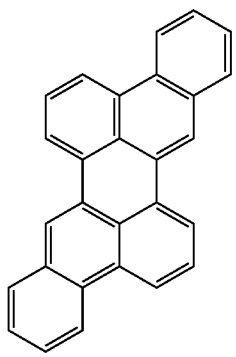

L4

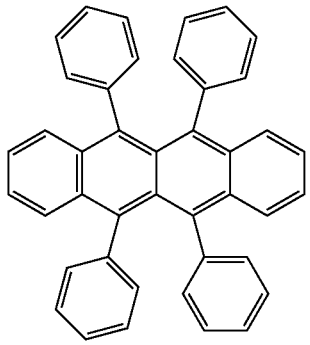

L5

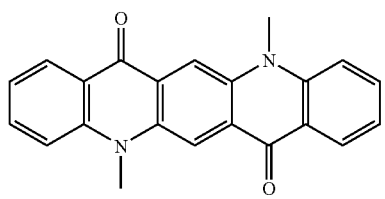

L6

-continued

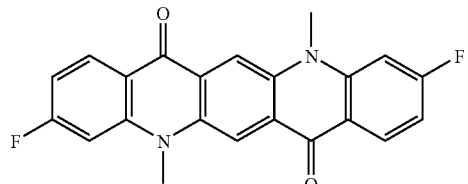

L7

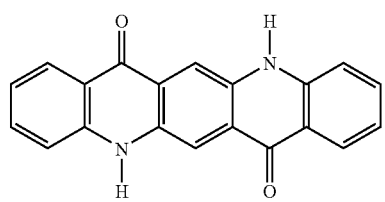

L8

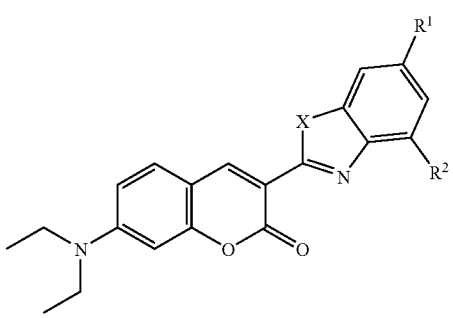

|     | X | R1     | R2     |
|-----|---|--------|--------|
| L9  | O | H      | H      |
| L10 | O | H      | Methyl |
| L11 | O | Methyl | H      |
| L12 | O | Methyl | Methyl |
| L13 | O | H      | t-butyl|
| L14 | O | t-butyl| H      |
| L15 | O | t-butyl| t-butyl|
| L16 | S | H      | H      |
| L17 | S | H      | Methyl |
| L18 | S | Methyl | H      |
| L19 | S | Methyl | Methyl |
| L20 | S | H      | t-butyl|
| L21 | S | t-butyl| H      |
| L22 | S | t-butyl| t-butyl|

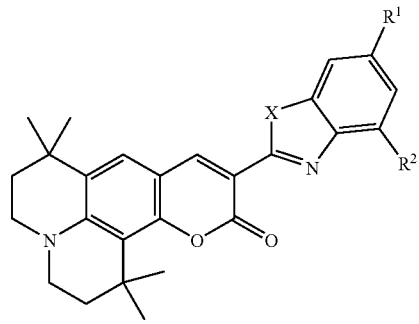

|     | X | R1 | R2     |
|-----|---|----|--------|
| L23 | O | H  | H      |
| L24 | O | H  | Methyl |

-continued

|     |   |        |        |
|-----|---|--------|--------|
| L25 | O | Methyl | H      |
| L26 | O | Methyl | Methyl |
| L27 | O | H      | t-butyl|
| L28 | O | t-butyl| H      |
| L29 | O | t-butyl| t-butyl|
| L30 | S | H      | H      |
| L31 | S | H      | Methyl |
| L32 | S | Methyl | H      |
| L33 | S | Methyl | Methyl |
| L34 | S | H      | t-butyl|
| L35 | S | t-butyl| H      |
| L36 | S | t-butyl| t-butyl|

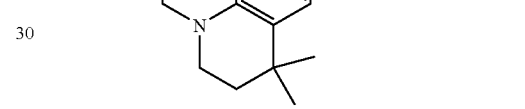

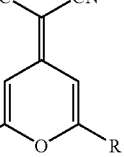

| | R |
|---|---|
| L37 | phenyl |
| L38 | methyl |
| L39 | t-butyl |
| L40 | mesityl |

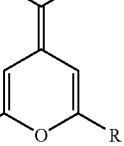

| | R |
|---|---|
| L41 | phenyl |
| L42 | methyl |
| L43 | t-butyl |
| L44 | mesityl |

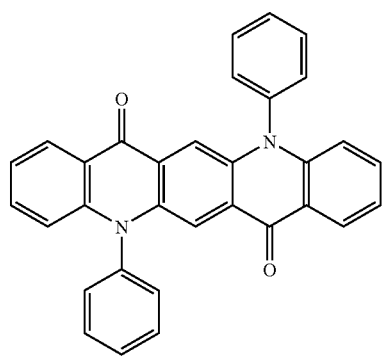
L45
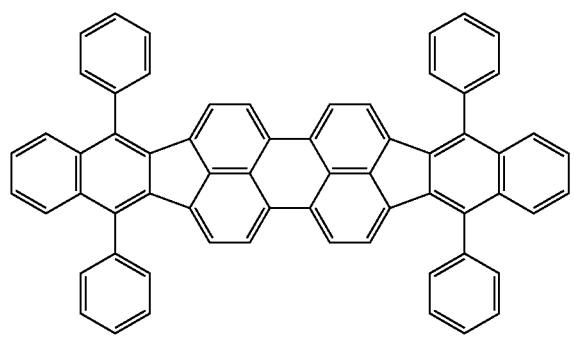
L46
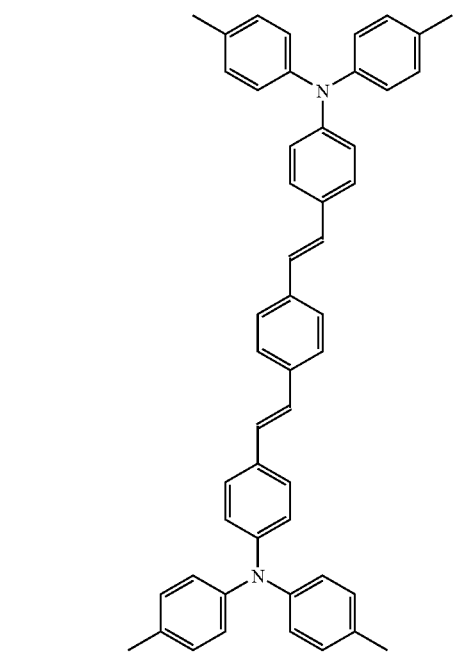
L47
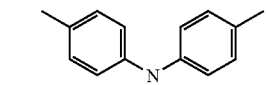
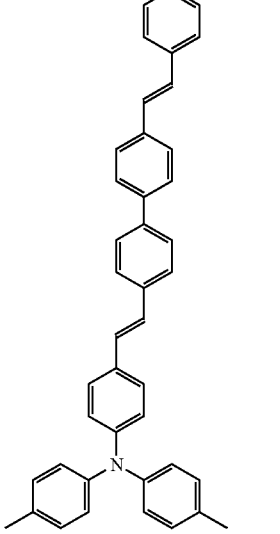
L48
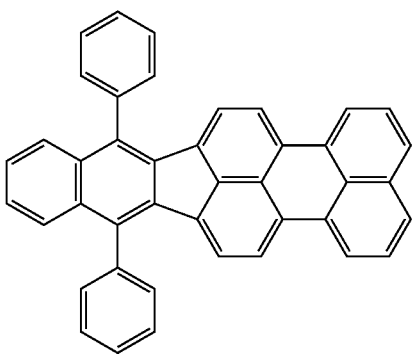
L49
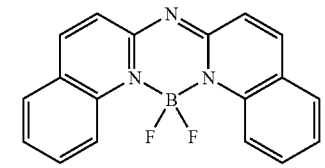
L50
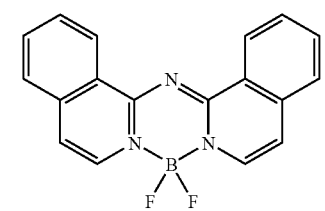
L51

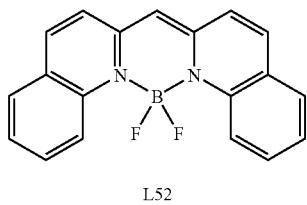

L52

Hole-Blocking Layer (HBL)

In addition to suitable hosts, an OLED device employing a phosphorescent material often requires at least one hole-blocking layer 110 placed between the electron-transporting layer 111 and the light-emitting layer 109 to help confine the excitons and recombination events to the light-emitting layer comprising the host and phosphorescent material. In this case, there should be an energy barrier for hole migration from the host into the hole-blocking layer, while electrons should pass readily from the hole-blocking layer into the light-emitting layer comprising a host and a phosphorescent material. The first requirement entails that the ionization potential of the hole-blocking layer 110 be larger than that of the light-emitting layer 109, desirably by 0.2 eV or more. The second requirement entails that the electron affinity of the hole-blocking layer 110 not greatly exceed that of the light-emitting layer 109, and desirably be either less than that of light-emitting layer or not exceed that of the light-emitting layer by more than about 0.2 eV.

When used with an electron-transporting layer whose characteristic luminescence is green, such as an Alq-containing electron-transporting layer as described below, the requirements concerning the energies of the highest occupied molecular orbital (HOMO) and lowest unoccupied molecular orbital (LUMO) of the material of the hole-blocking layer frequently result in a characteristic luminescence of the hole-blocking layer at shorter wavelengths than that of the electron-transporting layer, such as blue, violet, or ultraviolet luminescence. Thus, it is desirable that the characteristic luminescence of the material of a hole-blocking layer be blue, violet, or ultraviolet. It is further desirable, but not absolutely required, that the triplet energy of the hole-blocking material be greater than that of the phosphorescent material. Suitable hole-blocking materials are described in WO 00/70655 A2 and WO 01/93642 A1. Two examples of useful hole-blocking materials are bathocuproine (BCP) and bis(2-methyl-8-quinolinolato)(4-phenylphenylato)aluminum(III) (BAlq). The characteristic luminescence of BCP is in the ultraviolet, and that of BAlq is blue. Metal complexes other than BAlq are also known to block holes and excitons as described in U.S. 20030068528. In addition, U.S. 20030175553 A1 describes the use of fac-tris(1-phenylpyrazolato-N,C$^{2'}$)iridium(III) (Irppz) for this purpose.

When a hole-blocking layer is used, its thickness can be between 2 and 100 nm and suitably between 5 and 10 nm.

Electron-Transporting Layer (ETL)

Desirable thin film-forming materials for use in forming the electron-transporting layer 111 of the organic EL devices of this invention are metal-chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary of contemplated oxinoid compounds are those satisfying structural formula (E), previously described.

Other electron-transporting materials suitable for use in the electron-transporting layer 111 include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials. Triazines are also known to be useful as electron transporting materials.

If both a hole-blocking layer 110 and an electron-transporting layer 111 are used, electrons should pass readily from the electron-transporting layer 111 into the hole-blocking layer 110. Therefore, the electron affinity of the electron-transporting layer 111 should not greatly exceed that of the hole-blocking layer 110. Preferably, the electron affinity of the electron-transporting layer should be less than that of the hole-blocking layer or not exceed it by more than about 0.2 eV.

If an electron-transporting layer is used, its thickness may be between 2 and 100 nm and suitably between 5 and 20 nm.

Other Useful Organic Layers and Device Architecture

In some instances, layers 109 through 111 can optionally be collapsed into a single layer that serves the function of supporting both light emission and electron transportation. Layers 110 and 111 may also be collapsed into a single layer that functions to block holes or excitons, and supports electron transport. It also known in the art that emitting materials may be included in the hole-transporting layer 107. In that case, the hole-transporting material may serve as a host. Multiple materials may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, U.S. 20020025419, EP 1 182 244, U.S. Pat. No. 5,683,823, U.S. Pat. No. 5,503,910, U.S. Pat. No. 5,405,709, and U.S. Pat. No. 5,283,182 and can be equipped with a suitable filter arrangement to produce a color emission.

This invention may be used in so-called stacked device architecture, for example, as taught in U.S. Pat. No. 5,703,436 and U.S. Pat. No. 6,337,492.

Deposition of Organic Layers

The organic materials mentioned above are suitably deposited by any means suitable for the form of the organic materials. In the case of small molecules, they are conveniently deposited through sublimation or evaporation, but can be deposited by other means such as coating from a solvent together with an optional binder to improve film formation. If the material is a polymer, solvent deposition is usually preferred. The material to be deposited by sublimation or evaporation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. No. 5,688,551, U.S. Pat. No. 5,851,709 and U.S. Pat. No. 6,066,357) or an inkjet method (U.S. Pat. No. 6,066,357).

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as $SiO_x$, Teflon, and alternating inorganic/polymeric layers are known in the art for encapsulation. Any of these methods of sealing or encapsulation and desiccation can be used with the EL devices constructed according to the present invention.

Optical Optimization

OLED devices of this invention can employ various well-known optical effects in order to enhance their emissive properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color-conversion filters over the display. Filters, polarizers, and anti-glare or anti-reflection coatings may be specifically provided over the EL device or as part of the EL device.

Embodiments of the invention can provide advantageous features such as higher luminous yield, lower drive voltage, and higher power efficiency. Embodiments of the organometallic compounds useful in the invention can provide a wide range of hues including those useful in the emission of white light (directly or through filters to provide multicolor displays). Embodiments of the invention can also provide an area lighting device.

The invention and its advantages can be better appreciated by the following examples.

DEVICE EXAMPLES 1–3

An EL device (Device 1) satisfying the requirements of the invention was constructed in the following manner:

1. A glass substrate, coated with an approximately 85 nm layer of indium-tin oxide (ITO) as the anode, was sequentially ultrasonicated in a commercial detergent, rinsed in deionized water, degreased in toluene vapor and exposed to oxygen plasma for about 1 minute.
2. Over the ITO was deposited a 1 nm fluorocarbon (CFx) hole-injecting layer (HIL) by plasma-assisted deposition of CHF3.
3. An exciton-blocking layer (EBL) of 1,1-bis(4-di-p-tolylaminophenyl)cyclohexane (TAPC) having a thickness of 75 nm was then evaporated from a resistance-heated tantalum boat.
4. A 35 nm light-emitting layer (LEL) of 4,4'-bis(carbazol-9-yl)biphenyl (CBP) as a host and fac tris(2-phenylpyridinato-N,$C^{2'}$)iridium (III) [i.e., Ir(ppy)$_3$] as a guest present at 6 wt. % was then deposited onto the exciton-blocking layer. These materials were also evaporated from tantalum boats.
5. A hole-blocking layer (HBL) of bis(2-methyl-8-quinolinolato)(4-phenylphenylato)aluminum (III) (BAlq) having a thickness of 10 nm was then evaporated from another tantalum boat.
6. A 40 nm electron-transporting layer (ETL) of tris(8-quinolinolato) aluminum (III) (Alq) was then deposited onto the light-emitting layer. This material was also evaporated from a tantalum boat.
7. On top of the Alq layer was deposited a 220 nm cathode formed of a 10:1 volume ratio of Mg and Ag.

The above sequence completed the deposition of the EL device. The device, together with a desiccant, was then hermetically packaged in a dry glove box for protection against ambient environment.

A second EL device (Device 2) satisfying the requirements of the invention was fabricated in an identical manner to Device 1 except that the exciton-blocking layer was 37.5 μm thick and, in addition, a hole-transporting layer (HTL) was deposited between the HTL and the EBL. The HTL was 37.5 nm thick and consisted of N,N'-di-1-naphthyl-N,N'-diphenyl-4,4'-diaminobiphenyl (NPB).

A comparative EL device (Device 3) not satisfying the requirements of the invention was fabricated in an identical manner to Device 1 except that the exciton-blocking layer was replaced by a 75 nm thick HTL consisting entirely of NPB.

The cells thus formed were tested for efficiency and color at an operating current density of 20 mA/cm$^2$ and the results are reported in Table 1 in the form of luminance yield and CIE (Commission Internationale de l'Eclairage) coordinates.

TABLE 1

Evaluation Results for EL devices.

| Device | HTL and/or EBL materials | Efficiency (Cd/A) | Voltage (V) | Power efficiency (lm/W) | CIEx | CIEy | Type |
|---|---|---|---|---|---|---|---|
| 1 | TAPC | 31.1 | 12.4 | 7.88 | 0.316 | 0.622 | Invention |
| 2 | NPB,TAPC | 31.6 | 12.5 | 7.94 | 0.307 | 0.625 | Invention |
| 3 | NPB | 22.1 | 12.9 | 5.37 | 0.306 | 0.624 | Comparison |

As can be seen from Table 1, both EL devices incorporating an exciton-blocking layer according to the present invention demonstrated higher luminous and power efficiencies and lower drive voltages than the comparative device with no exciton-blocking layer.

The entire contents of the patents and other publications referred to in this specification are incorporated herein by reference. The invention has been described in detail with particular reference to certain preferred embodiments thereof, but it will be understood that variations and modifications can be effected within the spirit and scope of the invention.

PARTS LIST

| | |
|---|---|
| 101 | Substrate |
| 103 | Anode |
| 105 | Hole-Injecting layer (HIL) |
| 107 | Hole-Transporting layer (HTL) |
| 108 | Exciton-blocking layer (EBL) |
| 109 | Light-Emitting layer (LEL) |
| 110 | Hole-blocking layer (HBL) |
| 111 | Electron-Transporting layer (ETL) |
| 113 | Cathode |

What is claimed is:

1. An electroluminescent device comprising a cathode and an anode; and, located therebetween, a light-emitting layer (LEL) comprising a phosphorescent green-light-emitting material and a host material for the light-emitting material, and in a layer adjacent to the LEL on the anode side, an exciton-blocking layer containing a compound having a hole mobility of at least $1\times10^{-3}$ $cm^2V^{-1}s^{-1}$ and a triplet energy exceeding that of the green-light-emitting material of the LEL.

2. The device of claim 1 wherein the exciton-blocking layer contains a compound having a hole mobility of at least $5\times10^{-3}$ $cm^2V^{-1}s^{-1}$.

3. The device of claim 1 wherein the phosphorescent green-light-emitting material is an organometallic compound comprising a 5th-row Periodic Table transition metal.

4. The device of claim 2 wherein the metal is iridium or platinum.

5. The device of claim 2 wherein the organometallic compound includes a ligand that can be coordinated to a metal through an $sp^2$ carbon and a heteroatom.

6. The device of claim 4 wherein the ligand is a phenylpyridine group.

7. The device of claim 5 wherein the organometallic compound is chosen from tris(2-phenylpyridinato-N,$C^{2'}$)iridium(III), bis(2-phenylpyridinato-N,$C^{2'}$)iridium(III)(acetylacetonate), and bis(2-phenylpyridinato-N,$C^{2'}$)platinum(II) group containing compounds.

8. The device of claim 1 wherein the compound in the exciton-blocking layer is a triarylamine compound.

9. The device of claim 7 wherein the compound includes two or more distinct triarylamine groups and wherein no multiple-ring or fused-ring systems are attached simultaneously to the nitrogen atoms of the two or more triarylamine groups.

10. The device of claim 1 wherein the compound in the exciton-blocking layer is a represented by Formula (2):

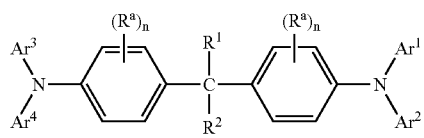

(2)

wherein:
$R^1$ and $R^2$ represent hydrogen or substituents, provided that $R^1$ and $R^2$ can join to form a ring;

$Ar^1$–$Ar^4$ represent independently selected aromatic groups;
each $R^a$ independently represents hydrogen or an independently selected substituent;
with the provision that $R^1$, $R^2$, $R^a$, and $Ar^1$–$Ar^4$ do not contain fused aromatic rings; and
each n is independently selected as 0–4.

11. The device of claim 10 wherein $R^1$ and $R^2$, independently represents hydrogen or an independently selected hydrocarbon substituent, provided that $R^1$ and $R^2$ can join to form a hydrocarbon ring, and each $R^a$ represents an independently selected hydrocarbon substituent.

12. The device of claim 8 wherein the compound is chosen from among:
1,1-Bis(4-(N,N-di-p-tolylamino)phenyl)cyclohexane (TAPC);
1,1-Bis(4-(N,N-di-p-tolylamino)phenyl)-4-phenylcyclohexane;
1,1-Bis(4-(N,N-di-p-tolylamino)phenyl)-4-methylcyclohexane; or
1,1-Bis(4-(N,N-di-p-tolylamino)phenyl)-3-phenylpropane.

13. An electroluminescent device comprising a cathode and an anode, and, located therebetween, a light-emitting layer (LEL) comprising a phosphorescent light-emitting material and a host for the light-emitting material, a hole-injecting layer, and, in a layer adjacent to the LEL on the anode side, an exciton-blocking layer containing a compound having a hole mobility of at least $1\times10^{-3}$ $cm^2V^{-1}s^{-1}$ and a triplet energy exceeding that of the phosphorescent light-emitting material of the LEL.

14. The device of claim 13 wherein the phosphorescent light-emitting material is an organometallic compound comprising a 5th-row Periodic Table transition metal.

15. The device of claim 14 wherein the transition metal is iridium or platinum.

16. The device of claim 14 wherein the organometallic compound includes a ligand that can be coordinated to a metal through an $sp^2$ carbon and a heteroatom.

17. The device of claim 16 wherein the ligand is a phenylpyridine group containing compound.

18. The device of claim 14 wherein the organometallic compound is chosen from tris(2-phenylpyridinato-N,$C^{2'}$)iridium(III), bis(2-phenylpyridinato-N,$C^{2'}$)iridium(III)(acetylacetonate), and bis(2-phenylpyridinato-N,$C^{2'}$)platinum(II) group containing compounds.

19. The device of claim 13 wherein the compound having hole mobility in the exciton-blocking layer is a triarylamine compound.

20. The device of claim 19 wherein the c compound having hole mobility in the exciton-blocking layer includes two or more triarylamine groups and wherein no multiple-ring or fused-ring systems are attached to the nitrogen atoms of two or more triarylamine groups.

21. The device of claim 13 wherein the compound having hole mobility in the exciton-blocking layer is a represented by Formula (2):

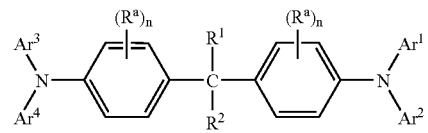

(2)

wherein:

R¹ and R² represent substituents, provided that R¹ and R² can join to form a ring;

Ar¹–Ar⁴ represent independently selected aromatic groups;

each $R^a$ independently represents hydrogen or an independently selected substituent;

with the provision that R¹, R², $R^a$, and Ar¹–Ar⁴ do not contain fused aromatic rings; and each n is independently selected as 0–4.

22. The device of claim 21 wherein R¹ and R², independently represent hydrogen or an independently selected hydrocarbon substituent, provided that R¹ and R² can join to form a hydrocarbon ring, and each $R^a$ independently represents a selected hydrocarbon substituent.

23. The device of claim 19 wherein the compound is chosen from:

1,1-Bis(4-(N,N-di-p-tolylamino)phenyl)cyclohexane (TAPC);

1,1-Bis(4-(N,N-(di-p-tolylamino)phenyl)-4-phenylcyclohexane;

1,1-Bis(4-(N,N-di-p-tolylamino)phenyl)-4-methylcyclohexane; and 1,1-Bis(4-(N,N'di-p-tolylamino)phenyl)-3-phenylpropane.

24. The device of claim 13 wherein the hole-injecting layer comprises a plasma-deposited fluorocarbon polymer.

25. An electroluminescent device comprising a cathode and an anode, and, located therebetween, a light-emitting layer (LEL) comprising a phosphorescent light-emitting material and a host for the light-emitting material, and, in a layer adjacent to the LEL on the anode side, an exciton-blocking layer containing a compound having a hole mobility of at least $1\times10^{-1}$ cm²V⁻¹s⁻¹ and a triplet energy exceeding that of the phosphorescent light-emitting material, and, on the cathode side of the LEL, a hole-blocking layer.

26. The device of claim 25 wherein the phosphorescent light-emitting material is an organometallic compound comprising a 5th-row Periodic Table transition metal.

27. The device of claim 26 wherein the metal is iridium or platinum.

28. The device of claim 25 wherein the organometallic compound includes a ligand that can be coordinated to a metal through an sp² carbon and a heteroatom.

29. The device of claim 25 wherein the ligand is a phenylpyridine grop containing compound.

30. The device of claim 25 wherein the organometallic compound is chosen from tris(2-phenylpyridinato-N,C²')iridium(III), bis(2-phenylpyridinato-N,C²')iridium(III)(acetylacetonate), and bis(2-phenylpyridinato-N,C²')platinum(II) group containing comounds.

31. The device of claim 25 wherein the compound in the exciton-blocking layer is a triarylamine compound.

32. The device of claim 31 wherein the compound includes two or more triarylamine groups and wherein no multiple-ring or fused-ring systems are attached to the nitrogen atoms of two or more triarylamine groups.

33. The device of claim 25 wherein the compound in the exciton-blocking layer is a represented by Formula (2):

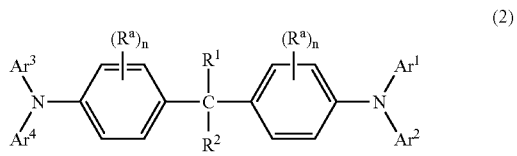

(2)

wherein:

R¹ and R² represent hydrogen or substituents, provided that R¹ and R² can join to form a ring;

Ar¹–Ar⁴ represent independently selected aromatic groups;

each $R^a$ independently represents hydrogen or an independently selected substituent;

with the provision that R¹, R², $R^a$, and Ar¹–Ar⁴ do not contain fused aromatic rings and;

each n is independently selected as 0–4.

34. The device of claim 33 wherein R¹ and R² independently represent hydrogen or an independently selected hydrocarbon substituent, provided that R¹ and R² can join to form a hydrocarbon ring and each $R^a$ represents a hydrocarbon substituent.

35. The device of claim 31 wherein the compound is chosen from:

1,1-Bis(4-(N,N-di-p-tolylamino)phenyl)cyclohexane (TAPC);

1,1-Bis(4-(N,N-di-p-tolylamino)phenyl)-4-phenylcyclohexane;

1,1-Bis(4-(N,N-di-p-tolylamino)phenyl)-4-methylcyclohexane; and 1,1-Bis(4-(N,N-di-p-tolylamino)phenyl)-3-phenylpropane.

36. The device of claim 25 wherein the hole-blocking layer comprises an aluminum complex that emits blue light when it luminesces.

37. The device of claim 36 wherein the aluminum complex is bis(2-methyl-8-quinolinolato)(4-phenylphenylato)aluminum(III).

38. The device of claim 1 wherein there is hole-transporting layer adjacent to the exciton-blocking layer on the anode side, comprising a material of Formula A:

A wherein:

$Q_1$ and $Q_2$ are independently selected aromatic tertiary amine moieties provided at least one of $Q_1$ or $Q_2$ contains a polycyclic fused ring; and G is an aryl group.

39. The device of claim 13 wherein there is a hole-transporting layer adjacent to the exciton-blocking layer on the anode side, comprising a material of Formula A,

A wherein:
Q₁ and Q₂ are independently selected aromatic tertiary amine moieties provided at least one of Q₁ or Q₂ contains a polycyclic fused ring; and
G is an aryl group.

40. The device of claim 25 wherein there is hole-transporting layer adjacent to the exciton-blocking layer on the anode side, comprises a material of Formula A:

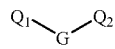

wherein:
Q₁ and Q₂ are independently selected aromatic tertiary amine moieties provided at least one of Q₁ or Q₂ contains a polycyclic fused ring; and
G is an aryl group.

41. The device of claim 1 including a means for emitting white light.

42. The device of claim 41 including two or more compounds capable of emitting complimentary colors.

43. The device of claim 41 including a compound capable of emitting white light.

44. The device of claim 41 including a filtering means.

45. A display comprising the electroluminescent device of claim 1.

46. An area lighting device comprising the electroluminescent device of claim 1.

47. The device of claim 1 wherein the host in the LEL layer comprises a carbazole represented by Formula 1:

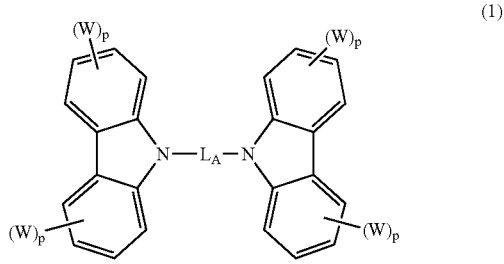

wherein:
W independently represents hydrogen or an independently selected substituent;
each p independently is 0–4, and
$L_A$ represents a linking group.

48. A process for emitting light comprising applying a potential across the device of claim 1.

* * * * *